US008385131B2

(12) United States Patent
Seol

(10) Patent No.: US 8,385,131 B2
(45) Date of Patent: Feb. 26, 2013

(54) MEMORY DEVICES SUPPORTING SIMULTANEOUS PROGRAMMING OF MULTIPLE CELLS AND PROGRAMMING METHODS THEREOF

(75) Inventor: KwangSoo Seol, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 254 days.

(21) Appl. No.: 12/838,962

(22) Filed: Jul. 19, 2010

(65) Prior Publication Data
US 2011/0013458 A1    Jan. 20, 2011

(30) Foreign Application Priority Data

Jul. 20, 2009   (KR) .......................... 10-2009-0065955

(51) Int. Cl.
*G11C 16/04*   (2006.01)
(52) U.S. Cl. ......... 365/185.28; 365/185.11; 365/185.13; 365/185.17
(58) Field of Classification Search .............. 365/185.28
See application file for complete search history.

(56) References Cited

U.S. PATENT DOCUMENTS

| 5,973,962 | A | 10/1999 | Kwon |
| 6,906,940 | B1 * | 6/2005 | Lue ................................ 365/63 |
| 7,701,771 | B2 | 4/2010 | Jeong et al. |
| 7,940,563 | B2 * | 5/2011 | Yokoi ...................... 365/185.05 |
| 8,154,128 | B2 * | 4/2012 | Lung ............................. 257/758 |
| 2008/0031048 | A1 | 2/2008 | Jeong et al. |
| 2008/0149913 | A1 | 6/2008 | Tanaka et al. |
| 2009/0179257 | A1 | 7/2009 | Komori et al. |
| 2009/0310425 | A1 * | 12/2009 | Sim et al. ................. 365/185.29 |
| 2011/0032772 | A1 * | 2/2011 | Aritome ................... 365/185.29 |

FOREIGN PATENT DOCUMENTS

| JP | 2008-160004 A | 7/2008 |
| KR | 10-2008-0012667 A | 2/2008 |
| KR | 10-2008-0024971 A | 3/2008 |

* cited by examiner

*Primary Examiner* — Son Mai
(74) *Attorney, Agent, or Firm* — Myers Bigel Sibley & Sajovec, P.A.

(57) ABSTRACT

Some embodiments of the present invention provide methods of programming memory devices that include an array of vertical channels passing through a stacked plurality of word plates, wherein respective columns of vertical channels are configured to be coupled to respective bit lines. In some method embodiments, potentials of the vertical channels are boosted, followed by selectively applying respective data to vertical channels via the bit lines to thereby selectively change the potentials of the vertical channels according to the data. A program voltage is subsequently applied to a selected word plate to thereby program a plurality of cells.

46 Claims, 18 Drawing Sheets

MEMORY DEVICES SUPPORTING SIMULTANEOUS PROGRAMMING OF MULTIPLE CELLS AND PROGRAMMING METHODS THEREOF

CROSS-REFERENCE TO RELATED APPLICATIONS

This application claims the benefit of Korean Patent Application No. 10-2009-0065955, filed on Jul. 20, 2009, in the Korean Intellectual Property Office, the disclosure of which is incorporated herein by reference in its entirety.

BACKGROUND

The present invention relates to memory devices and methods of operation thereof and, more particularly, to multilayer memory devices and methods of operation thereof.

Non-volatile memory devices, such as flash memory devices, are used in a variety of applications, such as in digital cameras, netbook computers and the like. A typical flash memory device has a NAND configuration in which each bit line is connected to a string of serially-connected floating gate transistor memory cells, which are programmed by applying a programming voltages to gate electrodes to selectively set the threshold voltages thereof. Such devices and methods of programming thereof are described, for example, in U.S. Pat. No. 5,973,962 to Kwon.

A variety of architectures have been developed to increase the capacity of flash memory devices. For example, structures have been developed that include multiple layers memory cells wherein vertical columns of the cells are connected in a NAND arrangement. Examples of such structures are described, for example, in U.S. Patent Application Publication No. 2009/0179257 to Yosuke et al.

SUMMARY

Some embodiments of the present invention provide methods of programming memory devices that include an array of vertical channels passing through a stacked plurality of word plates, wherein respective columns of vertical channels are configured to be coupled to respective bit lines. In some method embodiments, potentials of the vertical channels are boosted, followed by selectively applying respective data to vertical channels via the bit lines to thereby selectively change the potentials of the vertical channels according to the data. A program voltage is subsequently applied to a selected word plate to thereby program a plurality of cells.

In some embodiments, respective columns of vertical channels are configured to be coupled to respective bit lines by respective groups of select gates, and boosting potentials of the vertical channels includes applying a first voltage to first ends of the vertical channels while applying a second voltage greater than the first voltage to the plurality of word plates to thereby boost the potentials of the vertical channels. Selectively applying respective data to vertical channels via the bit lines to thereby selectively change the potentials of the vertical channels according to the data includes selectively driving respective ones of the select gates while applying respective data to the bit lines to thereby selectively change the potentials of the vertical channels according to the data. Applying a program voltage to a selected word plate to thereby program a plurality of cells includes applying a third voltage to the selected word plate to thereby program a plurality of cells associated with the selected word plate.

The select gates may include upper select gates that control connection of the bit line to the column of vertical channels, and the memory device may further include lower select gates that control connection of the vertical channels to a source plate. Applying a first voltage to first ends of memory cell strings while applying a second voltage to the plurality of word plates to boost potentials of the column of vertical channels may include deactivating the upper select gates while applying the first voltage to the lower select gates and the source plate and applying the second voltage to the plurality of word plates. Applying a first voltage to first ends of memory cell strings while applying a second voltage to the plurality of word plates to boost potentials of the column of vertical channels may further include applying the first voltage to at least one of the bit lines while applying the first voltage to the lower select gates and the source plate and applying the second voltage to the plurality of word plates.

In some embodiments, applying a first voltage to first ends of memory cell strings while applying a second voltage to the plurality of word plates to boost potentials of the column of vertical channels may include deactivating the lower select gates while applying the first voltage to the upper select gates and the bit line and applying the second voltage to the plurality of word plates. Applying a first voltage to first ends of memory cell strings while applying a second voltage to the plurality of word plates to boost potentials of the column of vertical channels may further include applying a fourth voltage less than the first voltage to the source plate while applying the first voltage to the upper select gates and the bit line and applying the second voltage to the plurality of word plates.

In some embodiments, applying a third voltage to a selected word plate to thereby program a plurality of cells associated with the column of vertical channels and the selected word plate may include applying the third voltage to the selected word plate while applying a fourth voltage less than the third voltage to at least one non-selected word plate. The fourth voltage may be the same as the second voltage or less than the second voltage. Applying the third voltage to the selected word plate while applying a fourth voltage less than the third voltage to at least one non-selected word plate may include applying the third voltage to a selected word plate while applying the fourth voltage to at least one non-selected word plate not immediately adjacent the selected word plate and a fifth voltage less than the fourth voltage to at least one non-selected word plate immediately adjacent the selected word plate.

In further embodiments, selectively driving respective ones of the select gates while applying respective ones of a series of data to the bit line to thereby selectively change the potentials of the column of vertical channels according to the series of data is preceded by loading a plurality of latches with the data. Selectively driving respective ones of the select gates while applying respective ones of a series of data to the bit line to thereby selectively change the potentials of the column of vertical channels according to the series of data includes selectively driving respective ones of the select gates while connecting respective ones of the latches to the bit line to thereby selective change the potentials the column of vertical channels according to the series of data.

The methods may further include verifying a programming state of at least one of the memory cells associated with the selected word plate and, responsive to a verification failure, repeating the steps of boosting potentials of the vertical channels, selectively applying respective data to vertical channels via the bit lines to thereby selectively change the potentials of the vertical channels according to the data and applying a program voltage to a selected word plate at a new program voltage level. The methods may also include repeatedly performing the steps of boosting potentials of the vertical channels, selectively applying respective data to vertical channels via the bit lines to thereby selectively change the potentials of the vertical channels according to the data and applying a program voltage to a selected word plate to thereby perform multi-bit programming of the plurality of memory cells.

Further embodiments of the present invention provide memory devices including an array of vertical channels passing through a stacked plurality of word plates, a plurality of bit lines and a control circuit configured to boost potentials of the vertical channels, to selectively apply respective data to vertical channels via the bit lines to thereby selectively change the potentials of the vertical channels according to the data and to apply a program voltage to a selected word plate to thereby program a plurality of cells.

Some embodiments of the present invention provides a three-dimensional memory device that comprises a memory cell array where a plurality of wordline planes are stacked, a write and read circuit configured to simultaneously program memory cells of at least two pages included in a selected wordline plane; and a control circuit configured to control a program operation of the write and read circuit. In some embodiments, the write and read circuit latches program data of at least two pages to be programmed into the memory cells.

In some embodiments, the write and read circuit loads the latched program data in parallel to the memory cells through a plurality of bitlines by the unit of at least one page. The control circuit controls channels of the memory cells to be collectively boosted through a plurality of lower select transistors and a common select line corresponding to the memory cells before the program data is loaded to the memory cells.

In some embodiments, the control circuit controls a voltage rising to a predetermined level to be applied to a bitline corresponding to the memory cells during the boosting operation.

In some embodiments, the control circuit controls channels of the memory cells to be collectively boosted through a plurality of upper select transistors and a plurality of bitlines corresponding to the memory cells before the program data is loaded to the memory cells.

In some embodiments of the present invention, channels of the memory cells is boosted to a first pass voltage in compliance with the control of the control circuit before program data is loaded to the memory cells. The channels of the memory cells is maintained at the first pass voltage or discharged to a ground voltage level according to a value of data to be programmed to the memory cells during a data loading operation to the memory cells. States of voltages at the respective channels of the memory cells are determined by the data loading operation and maintained until a program operation is performed.

In some embodiments of the present invention, the program data is loaded to the memory cells, the control circuit controls a program operation for the loaded program data to be performed the program operation by applying a program voltage higher than the first pass voltage to the selected wordline plane and applying a second pass voltage equal to or lower than the first pass voltage to unselected wordline planes. A difference between the first pass voltage and the second pass voltage is calculated from the amount of charges required to program the memory cells.

In some embodiments of the present invention, a level of the second pass voltage applied to the respective unselected wordline planes varies with positions of the unselected wordline planes.

In some embodiments of the present invention, the control circuit controls a local voltage to be applied to at least one wordline plane adjacent to the selected wordline plane among the plurality of unselected wordline planes during the program operation.

The local voltage may be equal to or higher than a ground voltage and lower than the second pass voltage. The local voltage may be higher than the second pass voltage and lower than the program voltage.

The control circuit controls the second pass voltage to be applied to at least one unselected wordline plane between the selected wordline plane to which the program voltage is applied and the adjacent wordline plane to which the local voltage is applied during the program operation.

In some embodiments of the present invention, the control circuit controls external charge supply to channels of the memory cells to be cut off during the program operation.

In some embodiment of the present invention, the write and read circuit programs one or more data bits to the respective memory cells in compliance with the control of the control circuit.

Some embodiments of the present invention provides a method for programming a three-dimensional memory device, which comprises performing channel boosting by applying a first pass voltage to a plurality of wordline planes, loading program data to memory cells of at least two pages disposed at a selected one of the wordline planes; and simultaneously programming the memory cells to which the program data is loaded.

In some embodiments of the present invention, performing channel boosting comprises collectively controlling charge paths to channels of the memory cells through a common select line and a plurality of lower select transistors corresponding to the memory cells.

In some embodiments of the present invention, performing channel boosting further comprises boosting a voltage applied to a plurality of bitlines corresponding to the memory cells to a predetermined level. performing channel boosting comprises collectively controlling charges paths to channels of the memory cells through a plurality of bitlines corresponding to the memory cells and a plurality of upper select transistors connected to the respective bitlines. Performing channel boosting may further comprise boosting a voltage applied to a common source line to a predetermined level.

In some embodiments of the present invention, the program data is loaded in parallel through a plurality of bitlines corresponding to the memory cells by the unit of predetermined data.

In some embodiments of the present invention, loading program data comprises respectively turning on a plurality of upper transistors connected to each bitline connected to the memory cells in sequence, loading corresponding program data to channels of corresponding memory cells through the respective turned-on upper select transistors, maintaining or discharging a voltage at the channels of the corresponding memory cells at a level of the first pass voltage or to a level of a ground voltage, depending on values of the respective loaded data, and respectively turning off the respective turned-on upper select transistors.

In some embodiments of the present invention, simultaneously programming the memory cells comprises applying a program voltage higher than the first pass voltage to the selected wordline plane and simultaneously applying a second pass voltage equal to or lower than the first pass voltage to a plurality of unselected wordline planes. Charges corresponding to a difference between the first pass voltage and the second pass voltage are separated from the unselected wordline planes and migrate to memory cells of the selected wordline plane. A difference between the first pass voltage and the second pass voltage is calculated from the amount of charges required to program the memory cells of the selected wordline plane. In this embodiment of the present invention, external charge supply to channels of the memory cells is cut off while the first pass voltage and the second pass voltage are applied.

In some embodiments of the present invention, simultaneously programming the memory cells further comprises applying a local voltage equal to or higher than a ground voltage and lower than the second pass voltage to at least one wordline plane adjacent to the selected wordline plane. Simultaneously programming the memory cells further comprises applying a local voltage higher than the second pass voltage and lower than the program voltage to at least one wordline plane adjacent to the selected wordline plane.

In some embodiments of the present invention, simultaneously programming the memory cells further comprises applying the second pass voltage to at least one unselected wordline plane between the selected wordline plane to which the program voltage is applied and the adjacent wordline plane to which the local voltage is applied.

In some embodiments of the present invention, the respective memory cells are simultaneously programmed with one or more data bits.

Some embodiments of the present invention, provides a memory system, which comprises a three-dimensional memory device, and a memory controller configured to control operations of the three-dimensional memory device in response to the request from a host, wherein the three-dimensional memory device includes a memory cell array where a plurality of wordline planes are stacked, a write and read circuit configured to simultaneously program memory cells of at least two pages included in a selected wordline plane, and a control circuit configured to control a program operation of the write and read circuit.

BRIEF DESCRIPTION OF THE DRAWINGS

Exemplary embodiments of the present invention will be more clearly understood from the following detailed description taken in conjunction with the accompanying drawings in which.

DETAILED DESCRIPTION OF EMBODIMENTS

Some embodiments of the present invention will now be described hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like items throughout.

It will be understood that when an item is referred to as being "connected" or "coupled" to another item, it can be directly connected or coupled to the other item or intervening items may be present. In contrast, when an item is referred to as being "directly connected" or "directly coupled" to another item, there are no intervening items present. As used herein, the term "and/or" includes any and all combinations of one or more of the associated listed items and may be abbreviated as "/".

It will be understood that, although the terms first, second, etc. may be used herein to describe various items, these items should not be limited by these terms. These terms are only used to distinguish one item from another. For example, a "first" item could be termed a "second" item, and, similarly, a "second" item could be termed a "first" item without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated items or operations but do not preclude the presence or addition of one or more other items or operations.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 1:
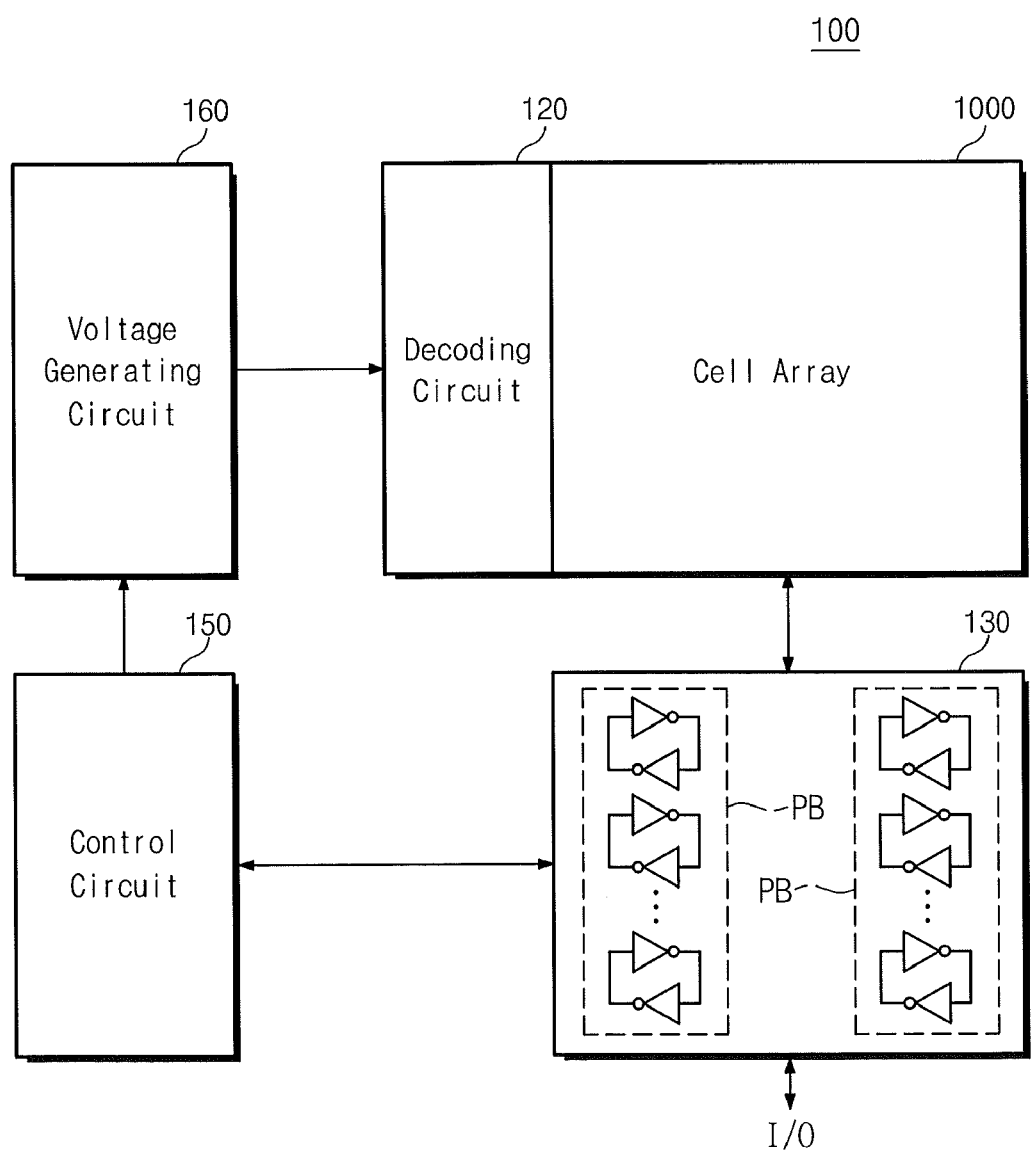
FIG. 1 is a block diagram of a memory device according to some embodiments of the present invention.

FIG. 1 illustrates a memory device 100 according to some embodiments of the present invention. The memory device 100 includes a NAND flash memory cell array 1000 and a decoding circuit 120 configured to generate control signals for accessing cells in the cell array 1000, such as word line signals and select signals. In a vertical NAND memory device as one embodiment of the present invention, memory cell array comprises a plurality of memory cell strings that extends vertically to a substrate. Respective memory cells may be single bit cell or multi-bit cell. The cells may be flash memory such as floating gate flash and charge trap flash (CTF). The decoding circuit 120 receives voltages to be applied to the cell array 1000 from a voltage generating circuit 160. The write and read circuit 130 includes a plurality of page buffers (PB). One page buffer may connect one bit line which connects a plurality of memory cell strings. Each page buffer contains a plurality of latches and N data may be latched to each page buffer. The number of latches in each buffer corresponds to the number of pages of the memory cell array. In some embodiments of the present invention, the number of latches is equal to, or more than or less than the number of pages of the memory cell array. A write and read circuit 130 including a plurality of latches provides data signals to bit lines of the cell array 1000. A control circuit 150 controls the write and read circuit 130 and the voltage generating circuit 160. A voltage generating circuit 160 create various levels of voltage to word line, a well disposed in a substrate.

Figure 2:
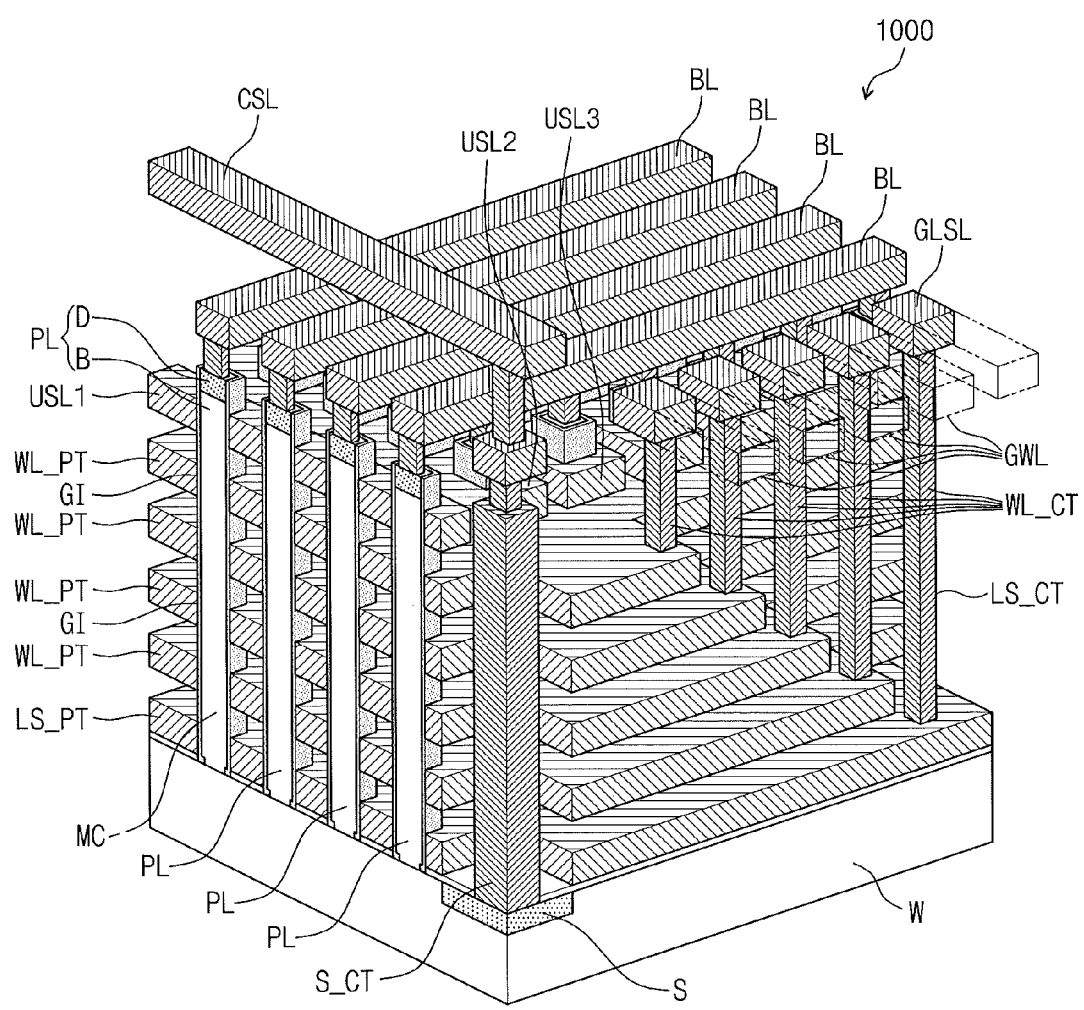
FIG. 2 is a perspective view of a NAND flash memory device with vertical channels according to some embodiments of the present invention.

FIG. 2 is a perspective view illustrating an exemplary structure for the memory cell array 1000. The memory cell array 1000 has a multi-layer structure including stacked word line plates WL_PL vertically disposed between an array of upper select lines USL1, USL2, USL3, . . . and a lower select plate LS_PT. Pillars PL pass through the word line plates WL_PL to provide vertical channels. Gate insulator layers GI separate the pillars PL from the word line plates WL_PL, the upper select lines USL1, USL2, USL3, . . . and the lower select plate LS_PT. Upper ends of the pillars PL are connected to parallel bit lines BL that extend transverse to the upper select lines USL1, USL2, USL3, . . . Lower ends of the pillars PL are connected to a well W, which is electrically connected to a common source line CSL via a source line contact S_CT and diffusion region S, Word line contacts WL_CT connect the word line plates WL_PT to global word lines GWL. A lower select line may contact LSL_CT connects a global lower select line GLSL to the lower select plate LS_PT.

The structure shown provides a memory cell MC at each point of intersection of the word line plates WL_PT and the pillars PL. Lower select transistors are provided at the intersection of lower select plate LS_PT and the pillars PL, and upper select transistors are provided at the intersection of the upper select lines USL1, USL2, USL3, . . . and the pillars PL.

Figure 3:
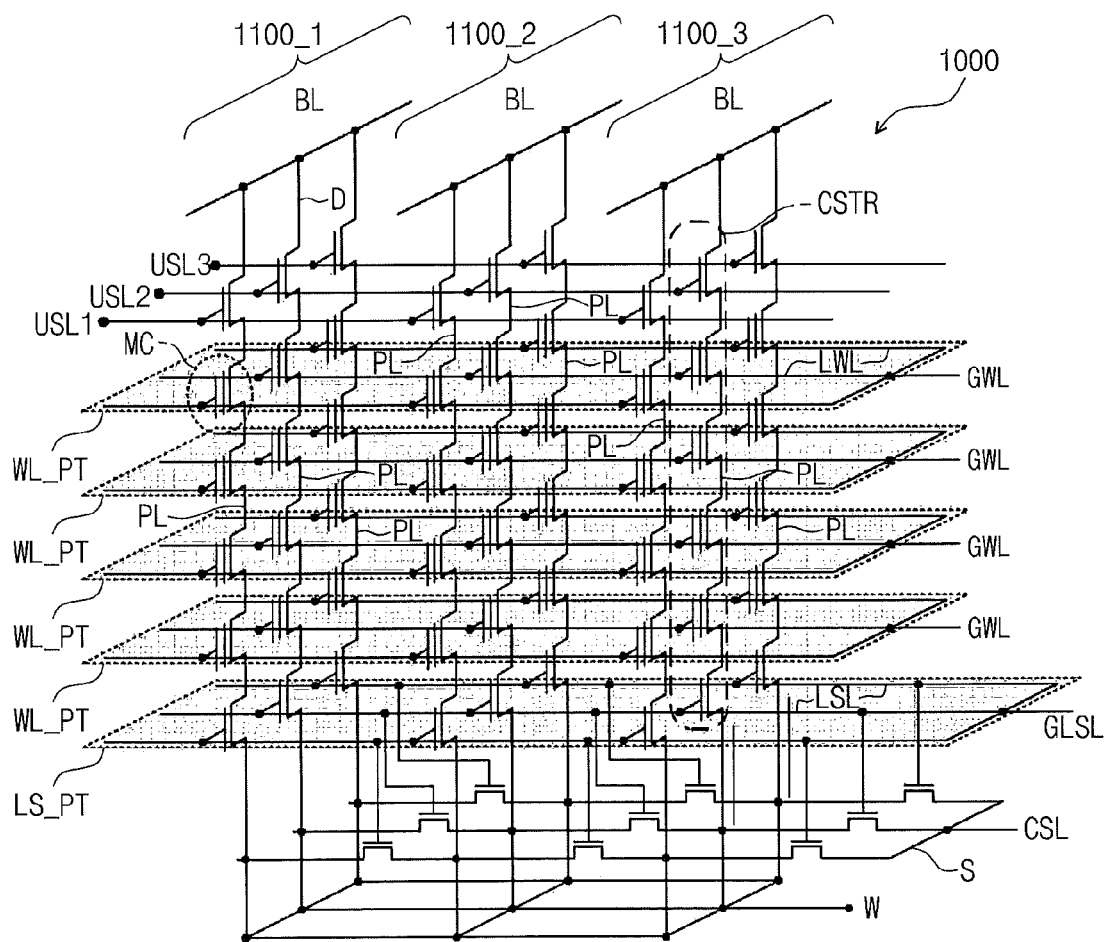
FIG. 3 is an equivalent circuit diagram for the memory device of FIG. 2.

FIG. 3 is an equivalent circuit representation of the NAND flash memory cell array 1000. In particular, FIG. 3 functionally illustrates vertical strings CSTR of serially-connected memory cells MC. Respective groups 1100-1, 1100-2, 1100-3 of the strings CSTR are connected to respective bit lines BL.

According to some embodiments of the present invention, a memory cell array such as the memory cell array 1000 illustrated in FIGS. 2 and 3 can be programmed by using process wherein the vertical channels of the memory cells MC, i.e., the pillars PL, are first boosted to a predetermined potential, followed by selectively changing the potentials based on data to be stored in the memory cells MC and then programming the cells associated with a selected word line plate WL_PT by applying a programming voltage to the selected word line plate WL_PT.

In some embodiments of the present invention, memory cells of a plurality of pages may be simultaneously programmed with one time programming. Data of N pages to be programmed may be loaded in a plurality of latches disposed in page buffer (PB) (see phase A of FIGS. 5-10). Such data loading to page buffer may be performed in parallel in a plurality of bit lines. The number of latches may be same as, more than or less than the number of cell strings connected to a page.

FIGS. 4A-4D illustrate exemplary programming operations according to some embodiments of the present invention. In an operation illustrated in FIG. 4A, channels are boosted by applying a pass voltage Vpass to all of the word line plates WL_PT and applying the predetermined voltage Vcc to lower select gates LSG (i.e., gate electrode connected to the lower select plate LS_PT of FIGS. 2 and 3) and the common source line CSL and applying ground voltage, for example 0V to upper select gate (see B phase of FIG. 5). In a meanwhile, data may be stored in latches of page buffer for data loading.

Figure 4A:
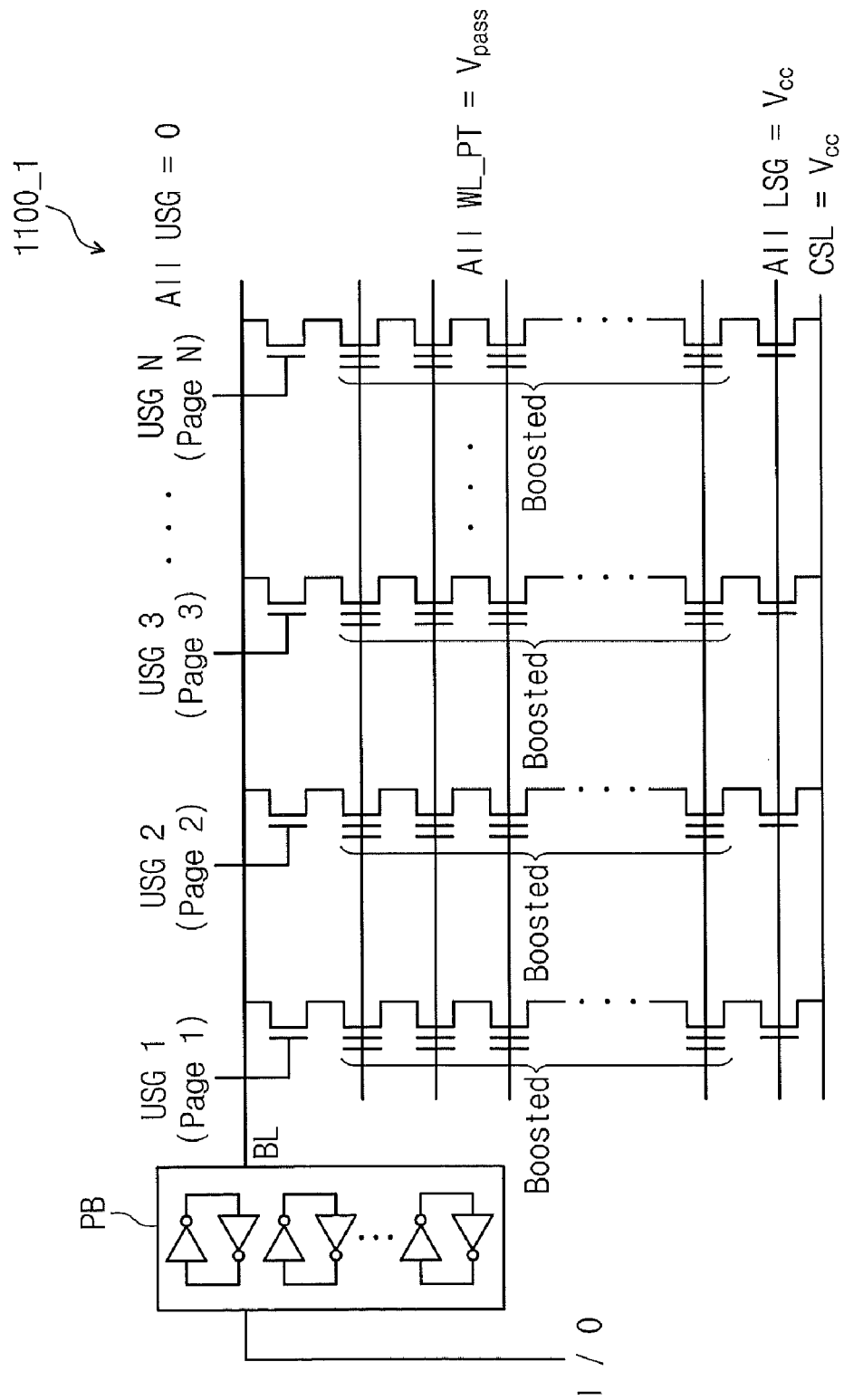
FIGS. 4A-4D are schematic diagrams illustrating programming operations for a NAND flash memory device according to some embodiments of the present invention.
Figure 4B:
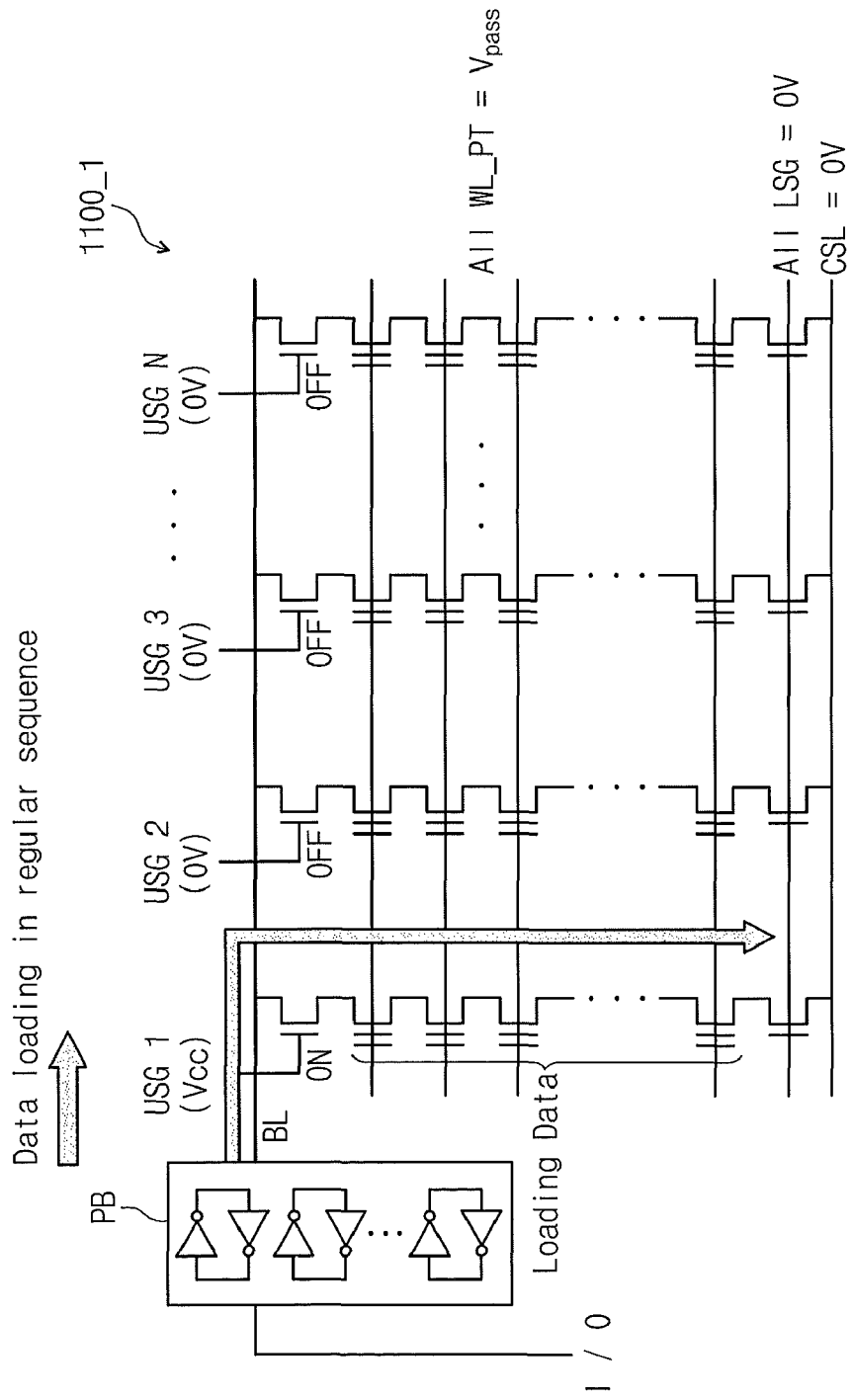
Figure 4C:
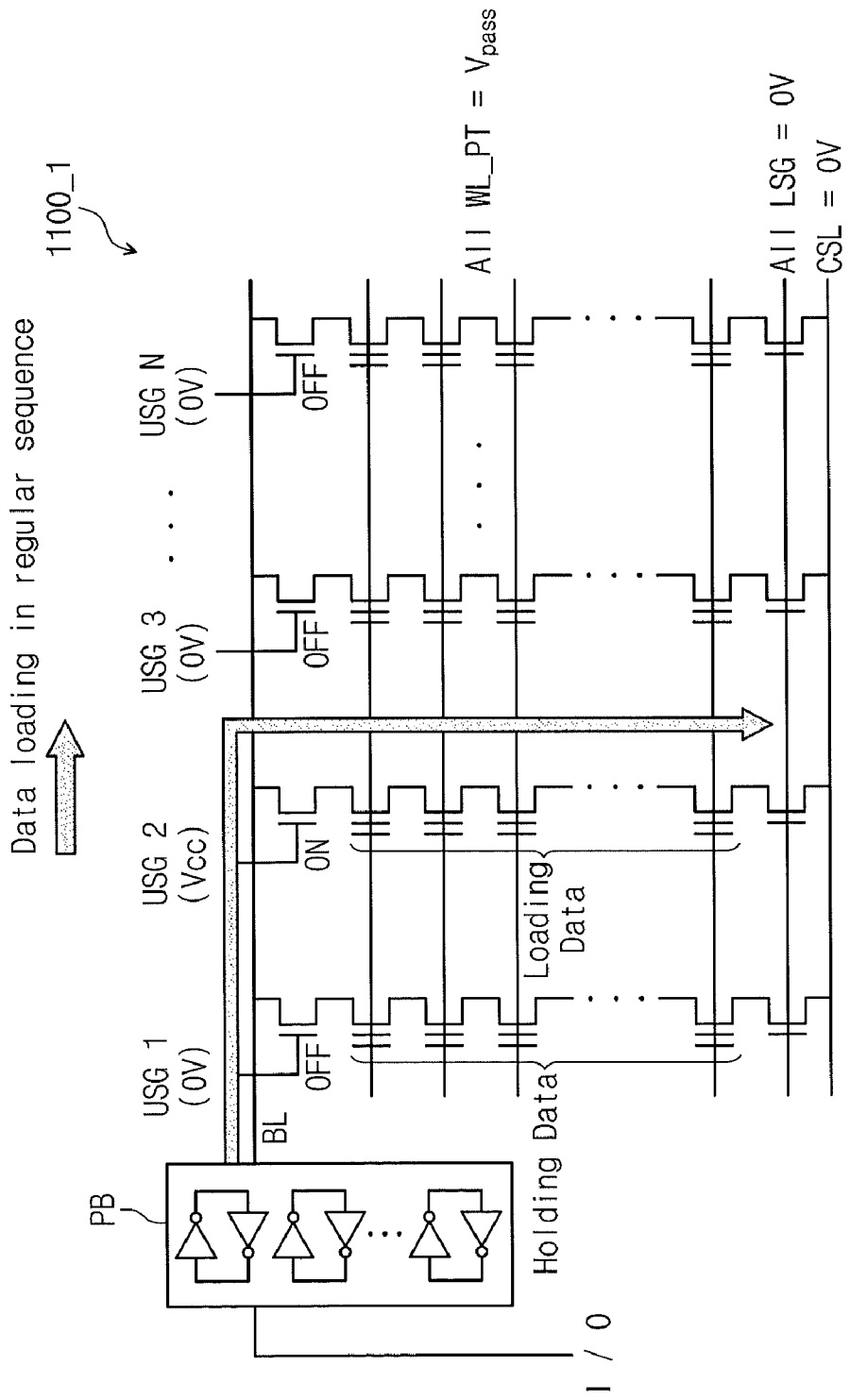

In a subsequent operations illustrated in FIGS. 4B and 4C, data stored in latches of a page buffer PB are then sequentially applied to the boosted channels via the bit line BL while sequentially, activating upper select gates USG1, USG2, USL3, . . . , USGN (i.e., gate electrodes coupled to the upper select lines USL of FIGS. 2 and 3), thus selectively changing the potentials of the boosted channels according to the data stored in the page buffer PB. As shown, the data from the page buffer PB is applied while lower select gates LSG are deactivated by applying 0V to lower select gate. This data loading from the latch of the bit line to the boosted channel may be performed in parallel at selected word line plate WL_PT. For example, while 1 to N data of a first bitline are loaded to 1st to Nth page, 1 to N data of other bitline (for example $2^{nd}$ and mth bitline) are loaded in parallel to $1^{st}$ to Nth page. As such, all data are loaded to channels of memory cells corresponding to the select word line.

Figure 4D:
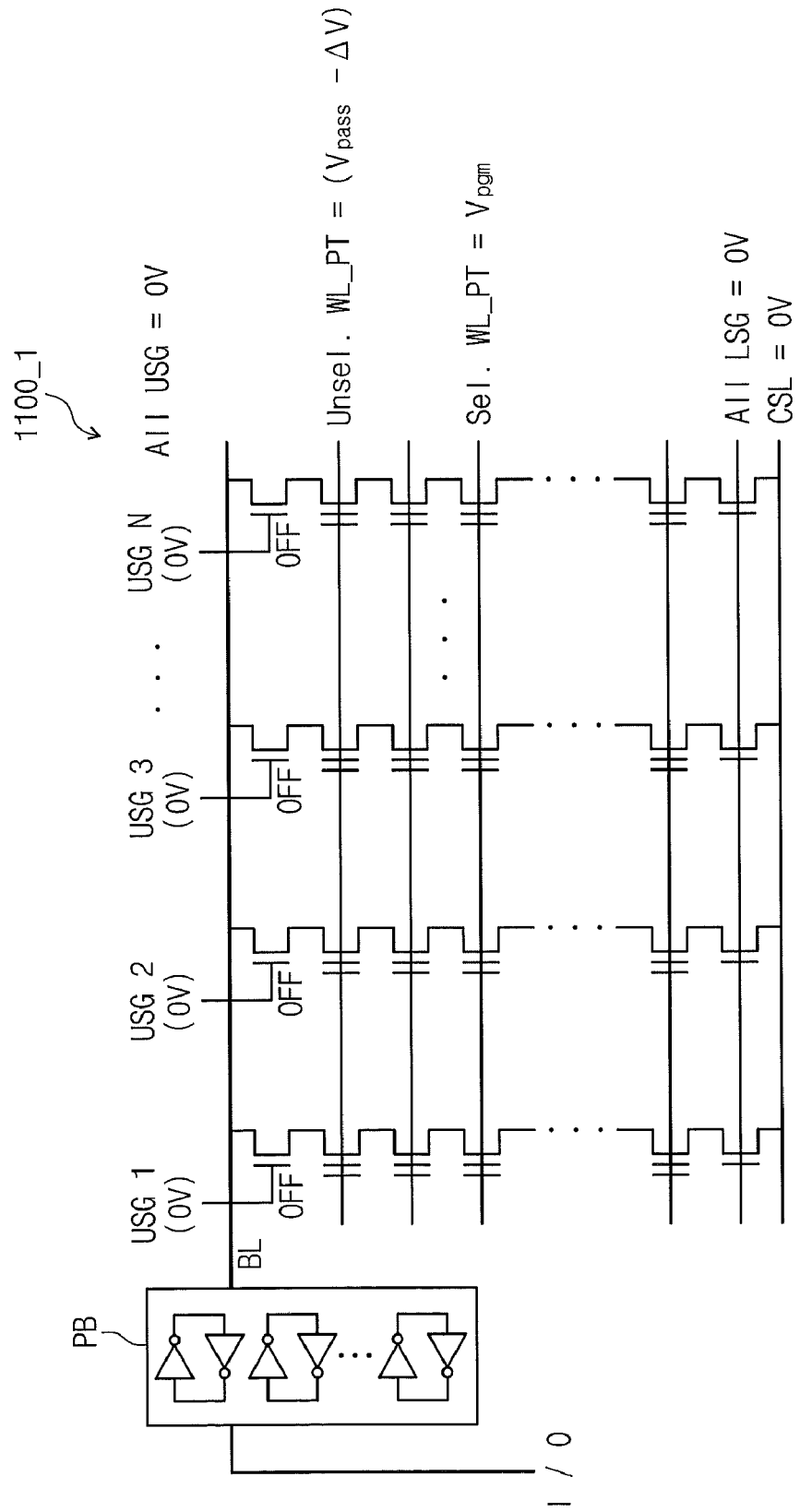

In an operation illustrated in FIG. 4D, after the data is applied, a programming voltage Vpgm is applied to a selected word line plate WL_PT while a pass voltage is applied to the unselected word line plates WL_PT, thus programming cells associated with the selected word line plate WL_PT. The pass voltage applied to the unselected word line plates WL_PT may be the same pass voltage Vpass applied when the channels are boosted or, as shown, this second pass voltage may be a reduced pass voltage Vpass-$\Delta$V. Use of the reduced pass voltage Vpass-$\Delta$V may cause charge to move toward the cell being programmed, thus potentially improving programming efficiency.

Figure 5:
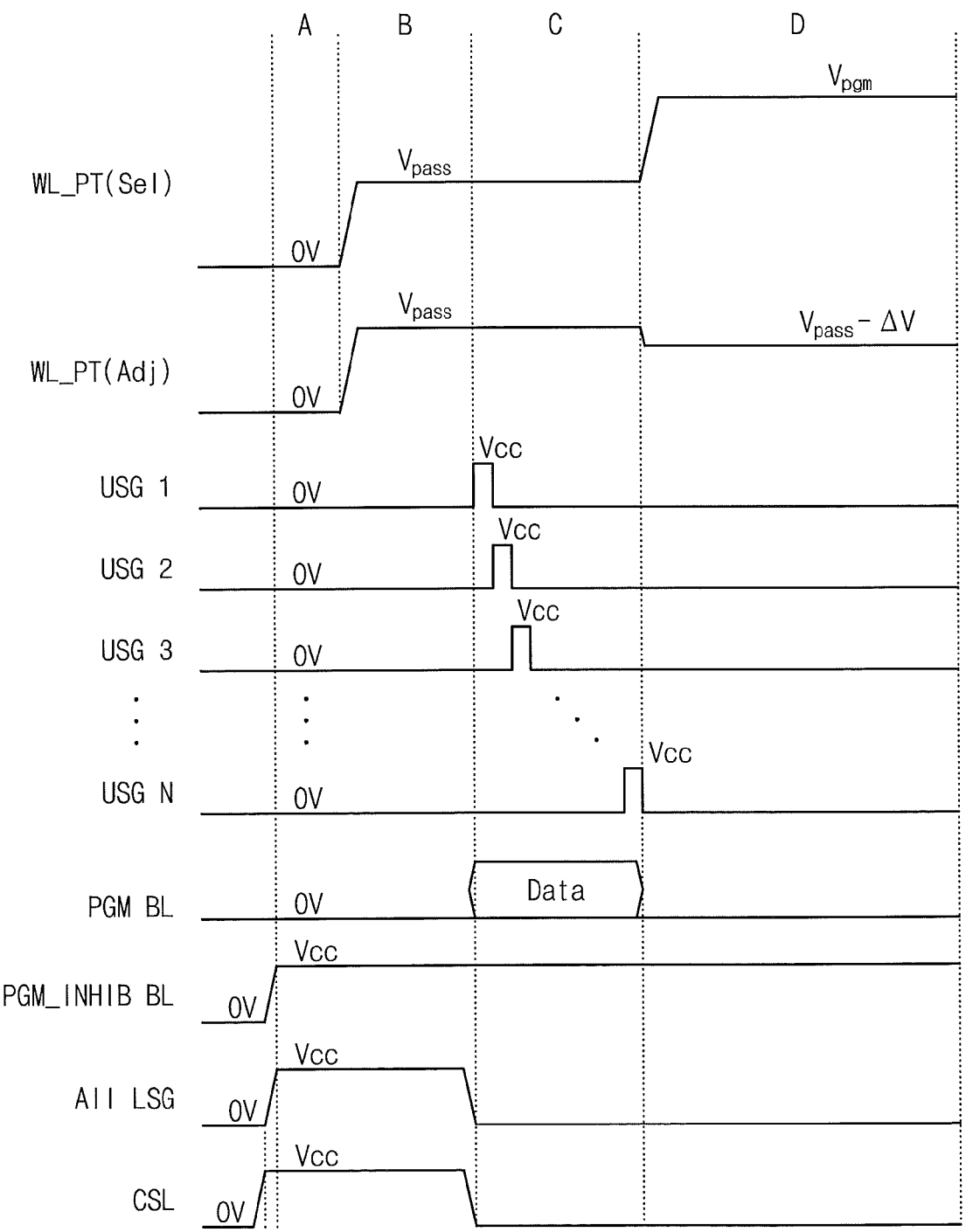
FIGS. 5-10 are timing diagrams illustrating programming operations for a NAND flash memory device according to various embodiments of the present invention.

FIGS. 5-10 illustrate variations on these programming operations according to further embodiments of the present invention. Referring to FIG. 5, in a first phase A, data are loaded in the page buffer PB latches, while a selected word line plate WL_PT(Sel), and adjacent unselected word line plate WL_PT(Adj), upper select gates USG1, USG2, USG3, . . . , USGN and a program bit line PGM BL (i.e., the bit line associated with cells to be programmed) are deactivated and the predetermined voltage Vcc is applied to the lower select gates LSG, the common source line CSL and a program inhibited bit line PGM_INHIB BL (i.e., a bit line associated with cells not to be programmed). In a next phase B, the channels are boosted by applying the pass voltage Vpass to the word line plates WL_PT while the predetermined voltage Vcc remains applied to the lower select gates LSG, the common source line CSL and the program inhibited bit line PGM_INHIB BL.

In a third phase C, the pass voltage Vpass is maintained on the word line plates WL_PT while the lower select gates LSG and the common source line are driven to a ground voltage. During this period, the upper select gates USG1, USG2, USG3, . . . , USGN are sequentially driven by the predetermined voltage Vcc while data are sequentially applied from the page buffer latches to the program bit line PGM BL. During this phase, the program inhibited bit line PGM_INHIB BL remains at the predetermined voltage Vcc.

Figure 6:
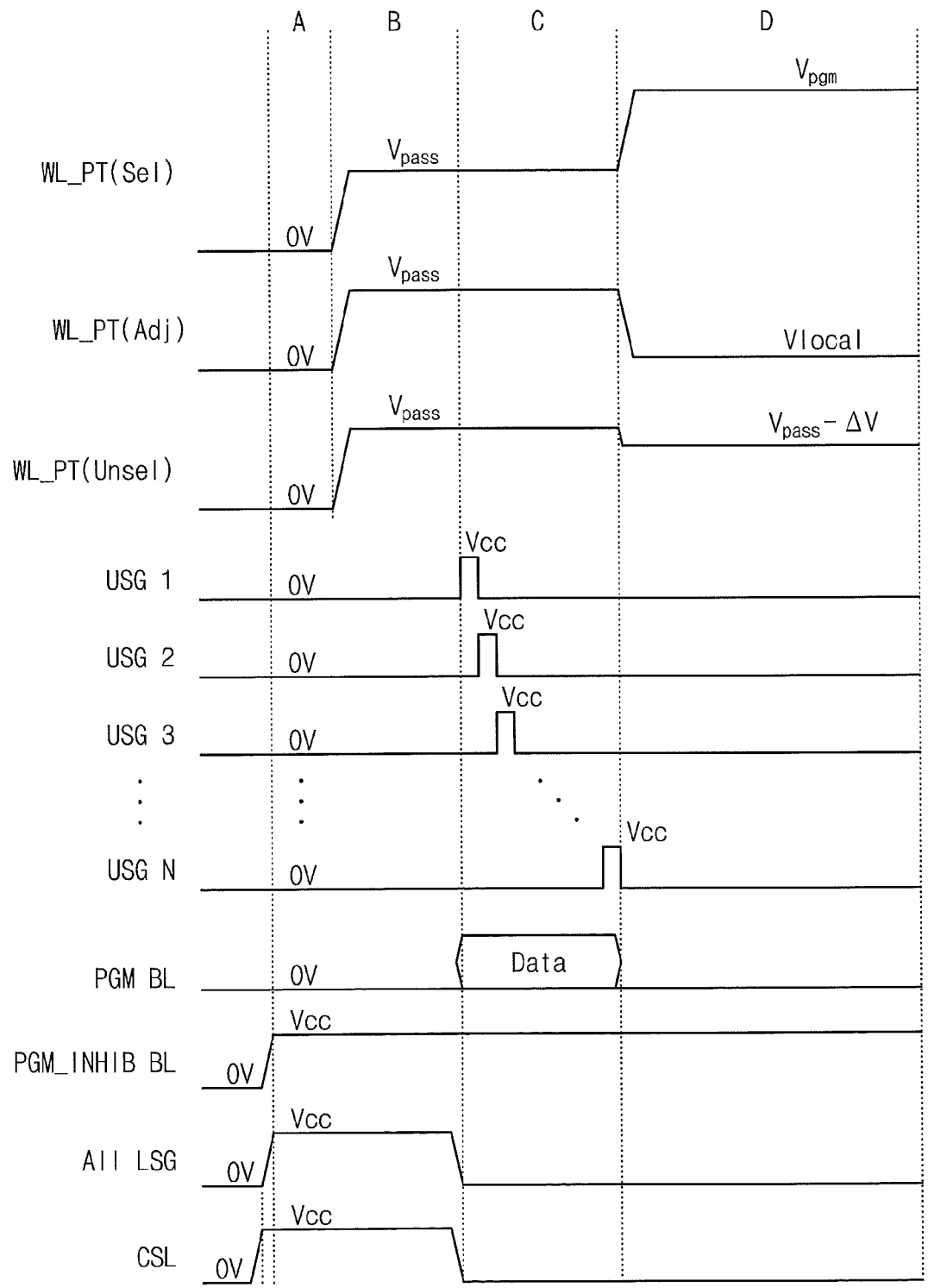

In a fourth phase D, the program voltage Vpgm is applied to the selected word line plate WL_PT(Sel), while the reduced pass voltage Vpass-$\Delta$V is applied to the adjacent unselected word line plate WL_PT(Adj), thus programming the cells associated with the selected word line plate WL_PT (Sel). During this phase, the upper select gates USG1, USG2, USG3, . . . , USGN and the lower select gates LSG remain deactivated. FIG. 6 illustrates a variation of the operations of FIG. 5, wherein, instead of applying the reduced pass voltage Vpass-ΔV to the adjacent unselected word line plate WL_PT (Adj) during the program phase D, an even lower voltage Vlocal is applied to the adjacent unselected word line plate WL_PT(Adjacent) while the reduced pass voltage Vpass-ΔV (or the higher pass voltage Vpass) is applied to non-adjacent unselected word line plates WL_PT(Unsel), thus providing local self-boosting.

Figure 7:
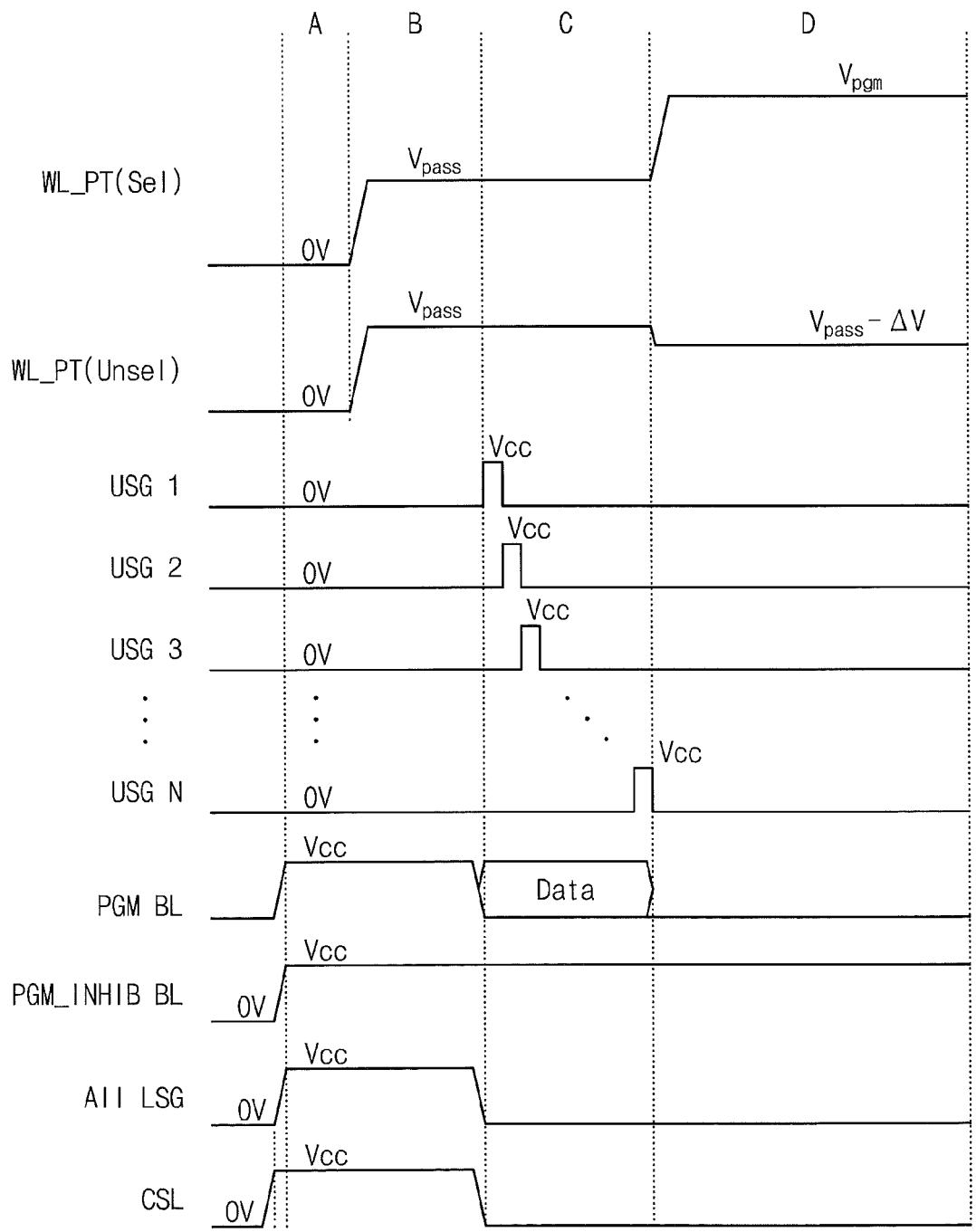
Figure 8:
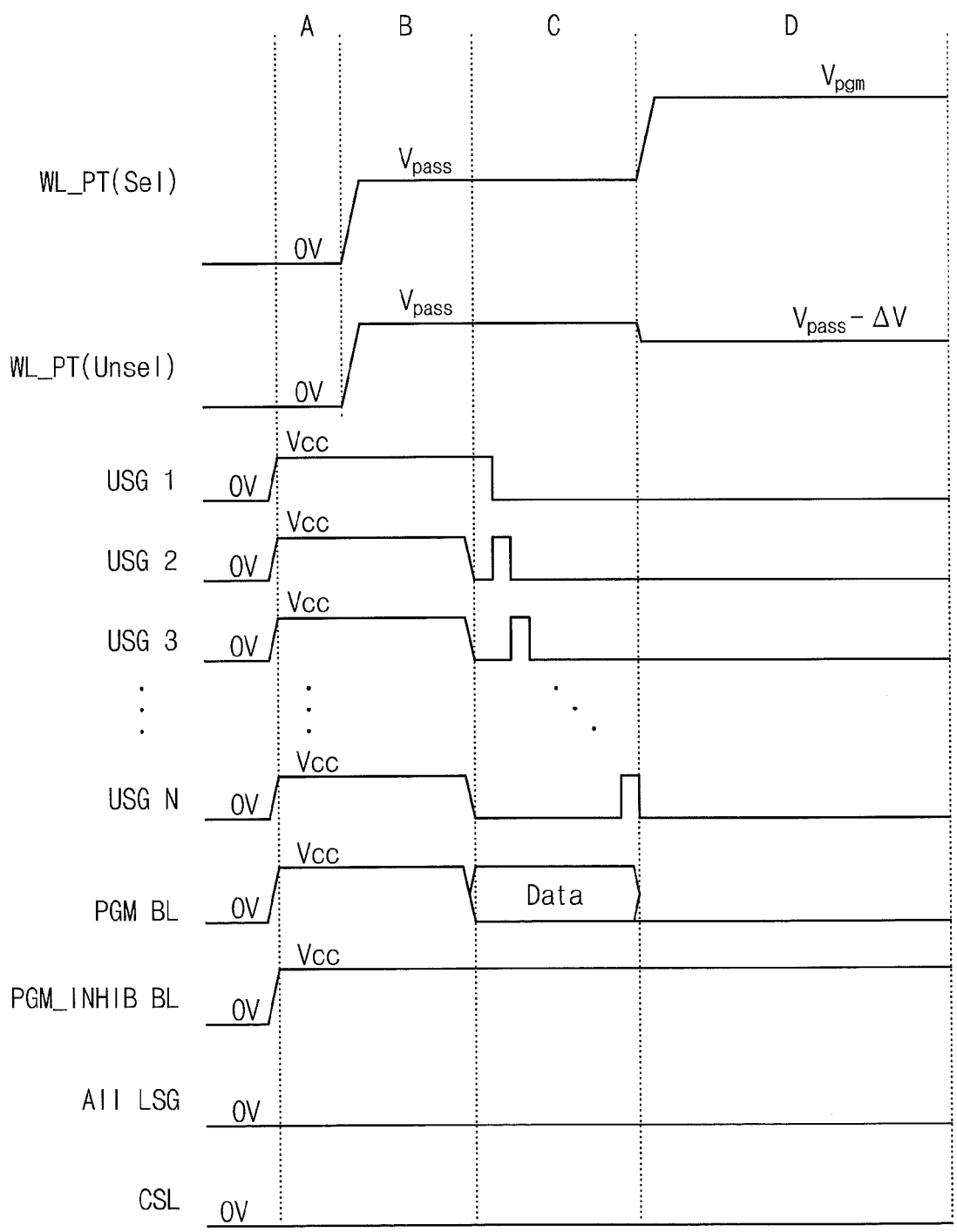

According to further embodiments of the present invention, a leakage barrier may be provided during a channel boosting phase. In particular, as shown in FIG. 7, the operations illustrated in FIG. 5 may be modified by applying the predetermined voltage Vcc to the program bit line PGM BL during the channel boost phase B. Operations in phases C and D may proceed as described above with reference to FIG. 5. In other embodiments, such a leakage barrier may be provided in programming operations as discussed above with reference to FIG. 6.

Figure 9:
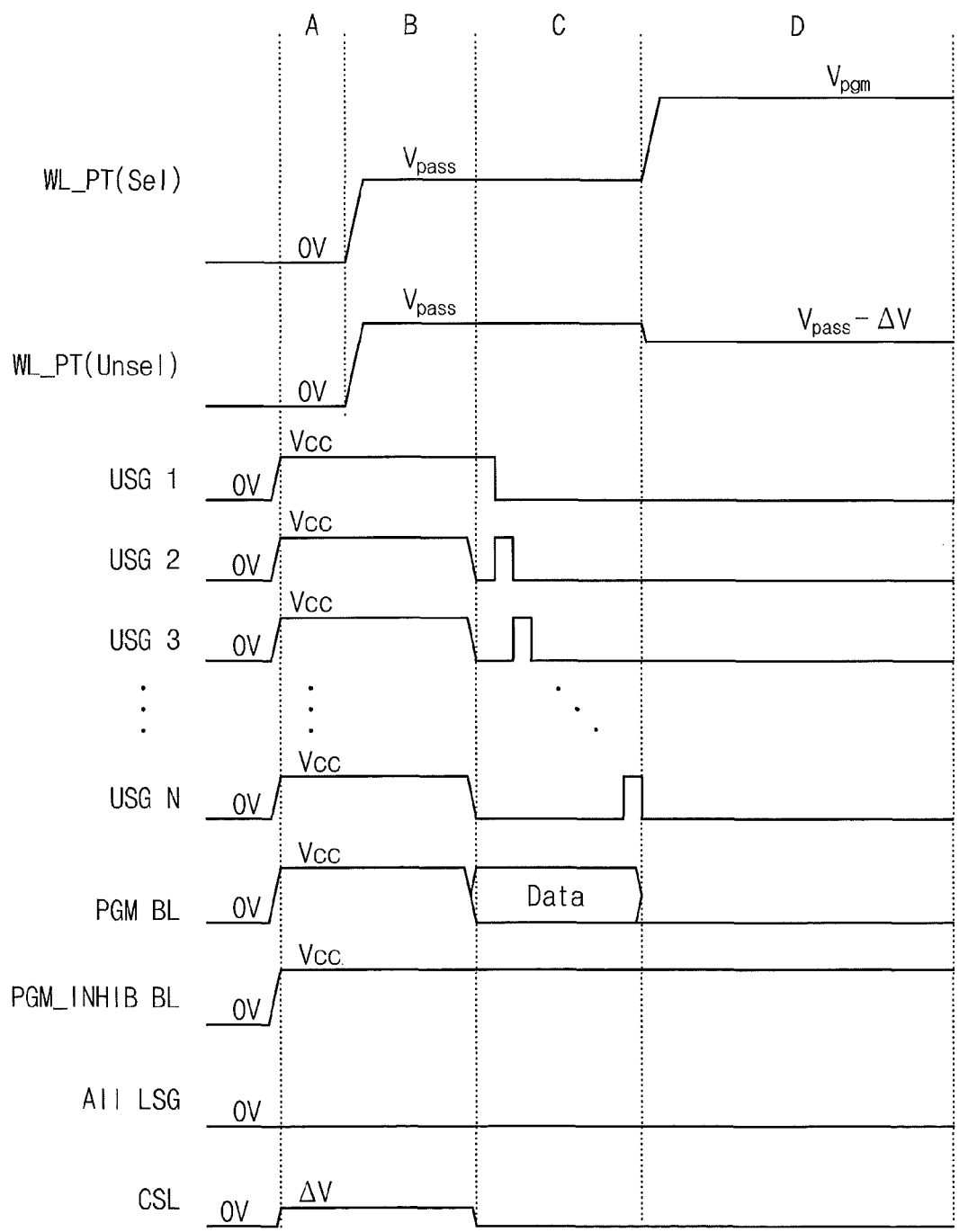
Figure 10:
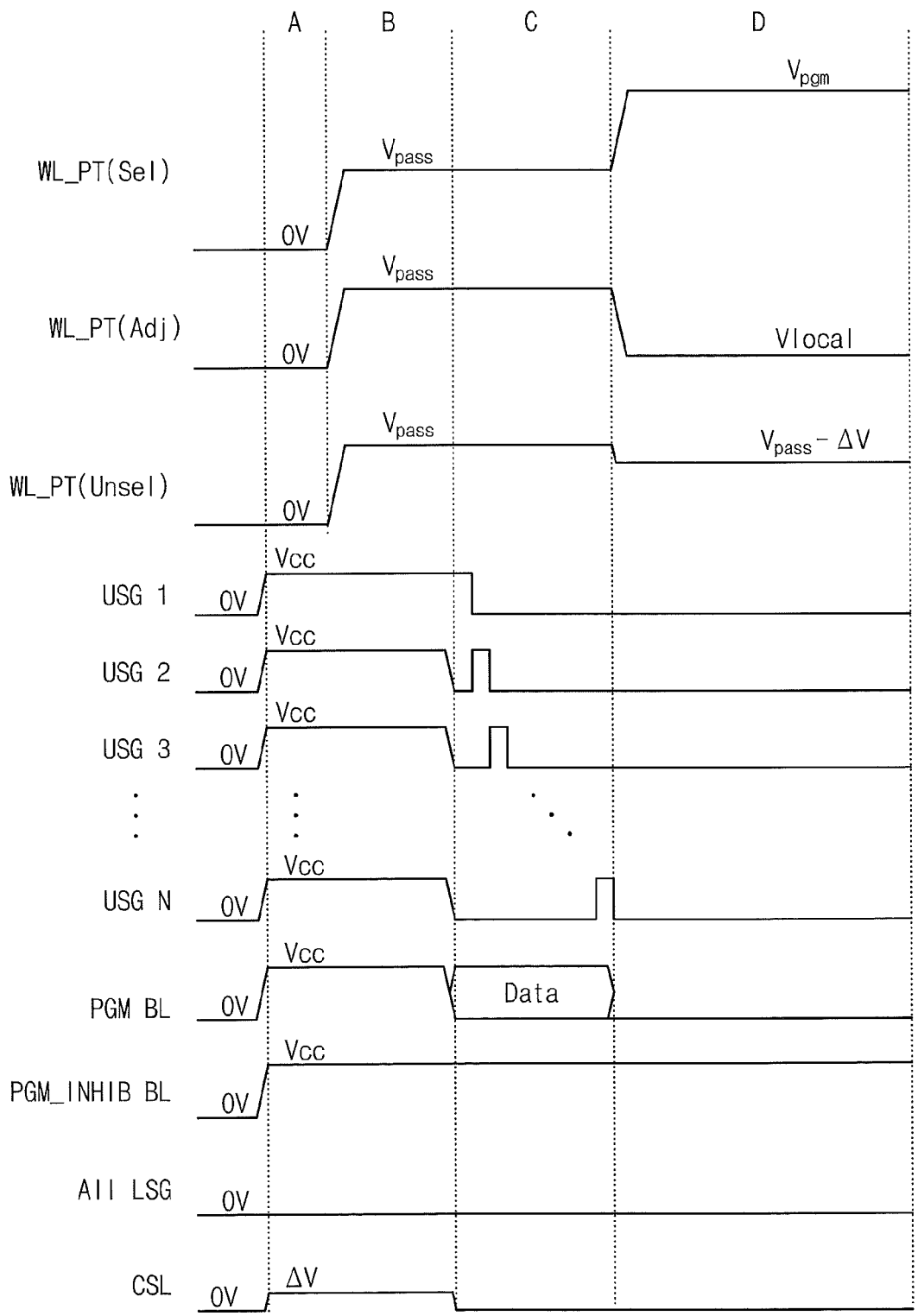

In additional embodiments, a "downstream" channel boosting technique may be substituted for the "upstream" channel boosting technique shown in FIGS. 5-7. In particular, referring to FIG. 8, the operations of FIG. 5 may be modified by applying the predetermined voltage Vcc to the program bit line PGM BL and the upper select gates USG1, USG2, USG3, . . . , USGN while applying a ground voltage to the lower select gates LSG and the common source line CSL. As illustrated in FIG. 9, this downstream channel boosting technique may be combined with a provision of a leakage barrier during the channel boost phase B by applying a voltage ΔV to the common source line CSL. As shown in FIG. 10, The operations of FIG. 9 may be modified to include provision of local self-boosting during the programming phase D by applying a reduced voltage Vlocal to an adjacent unselected word line plate WL_PT(Adj) during the program phase D.

Figure 11A:
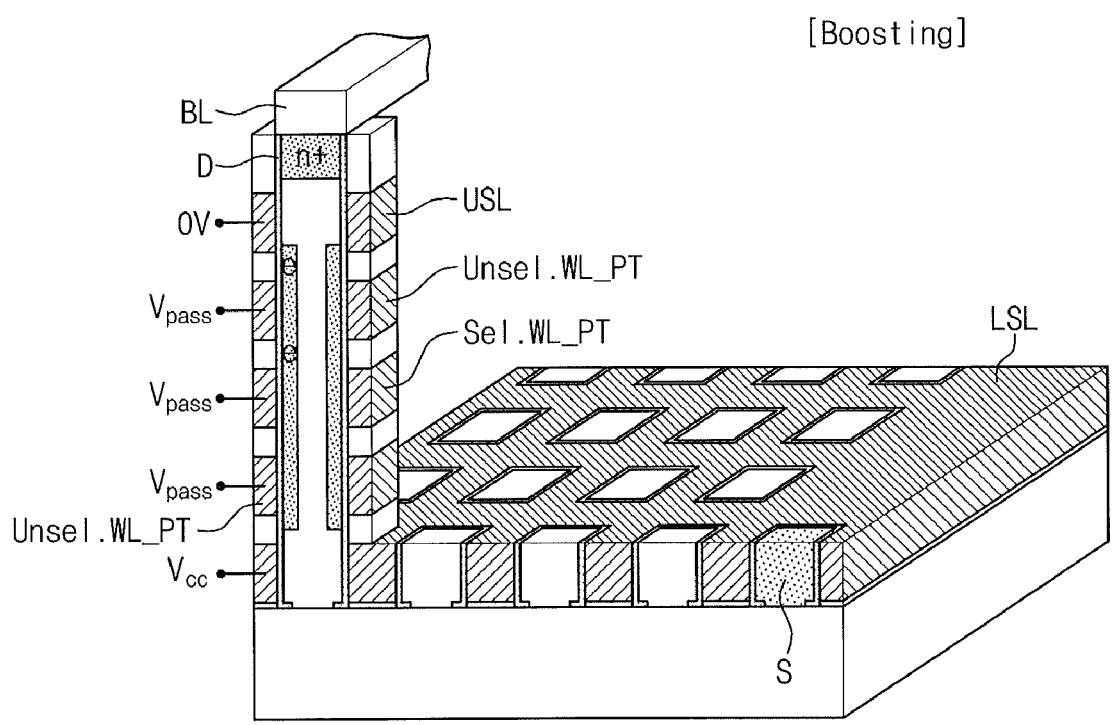
FIGS. 11A and 11B are perspective views of a NAND flash memory device illustrating programming operations according to further embodiments of the present invention.
Figure 11B:
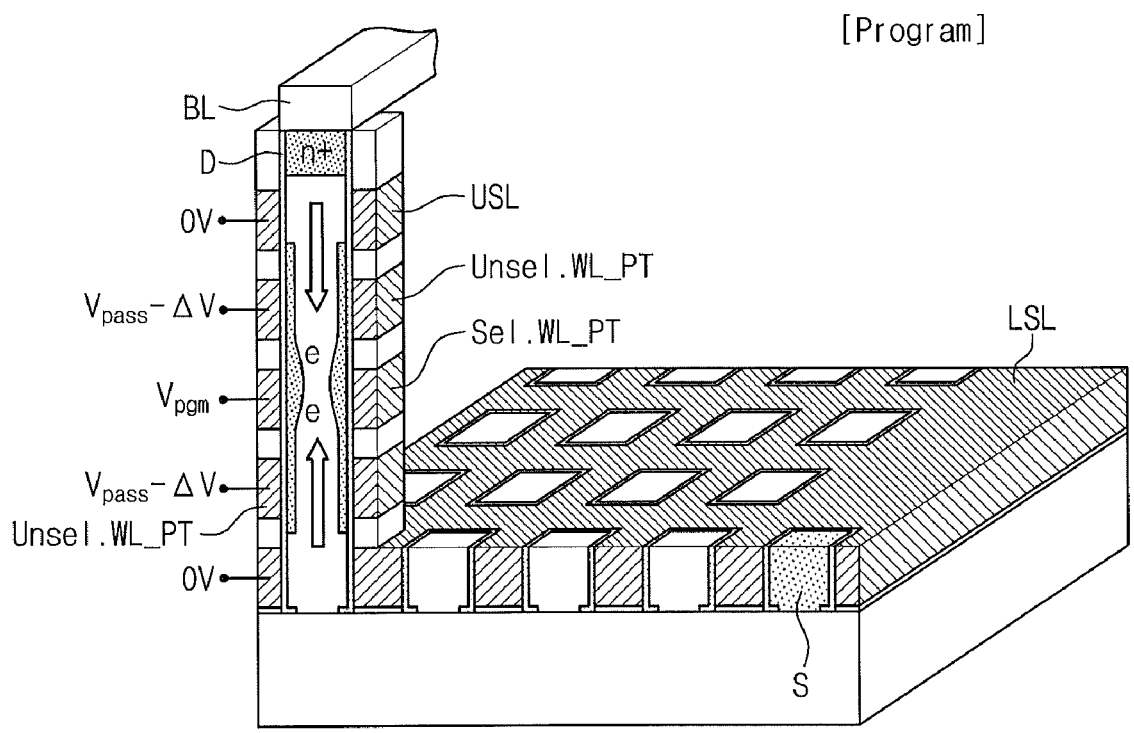

FIGS. 11A and 11B illustrate charge movement in the structure illustrated in FIG. 2 during boosting and program phases of program operations, respectively. In particular, electrons e that are relatively evenly distributed along the pillar PL between the upper select line USL and the lower select line LSL (FIG. 11A) move away from the unselected word line plates WL_PT(Unsel) toward the selected word line plate WL_PT(Sel) during the program phase (FIG. 11B).

Figure 12:
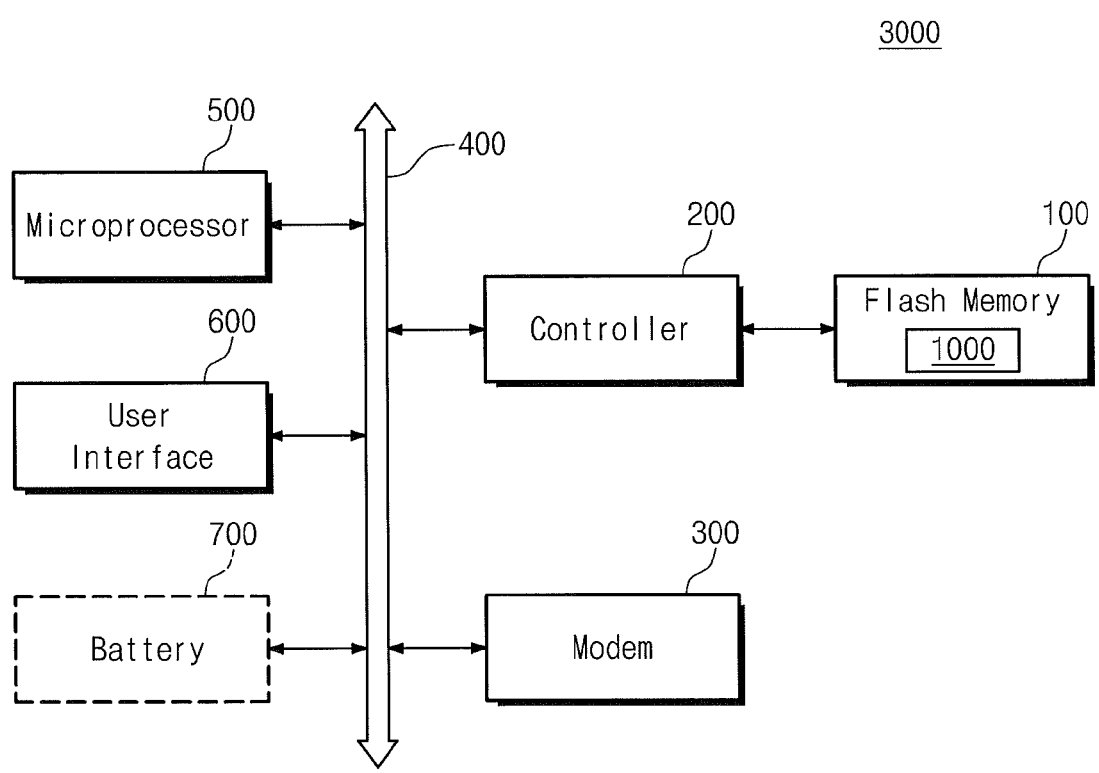
FIG. 12 is a schematic diagram illustrating a system incorporating a flash memory device according to some embodiments of the present invention.
Figure 13:
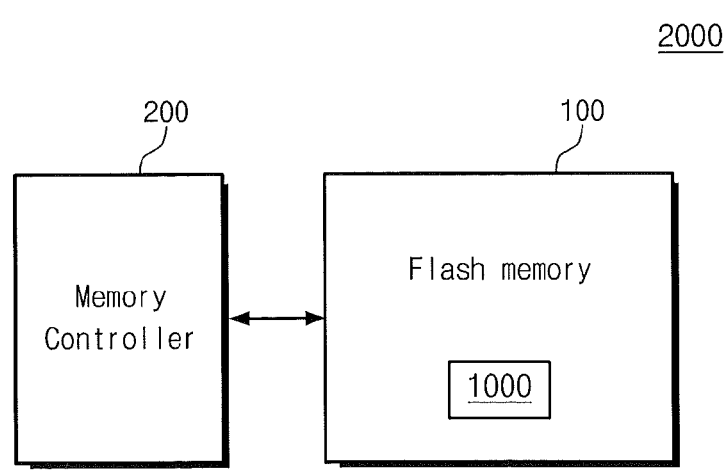
FIG. 13 is a block diagram illustrating a memory system according to some embodiments of the present invention.

FIG. 12 illustrates an example of an application of some embodiments of the present invention. A system 3000 (e.g., a desktop or laptop computer) includes a microprocessor 500, user interface 600, modem 330 and battery 700 coupled by one or more interconnecting busses 400. A memory controller 200 is communicatively coupled to these components and controls a flash memory 100 that includes a memory cell array 1000 along the lines discussed above. The controller 200 may be configured to support programming operations along the lines discussed above. As shown in FIG. 13, the controller 200 and the memory 100 may be combined as a memory system 2000, e.g., integrated in a memory card or other module.

Figure 14:
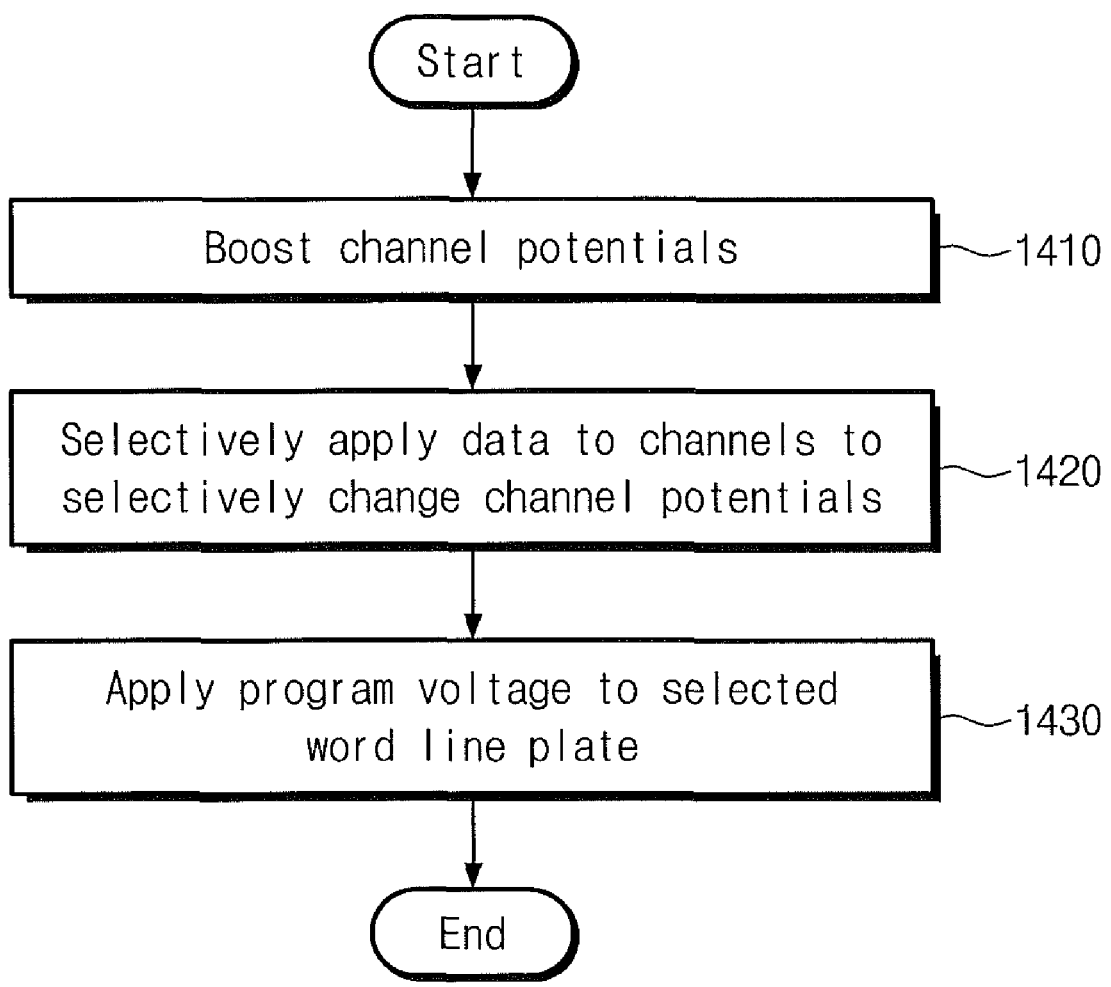
FIGS. 14 and 15 are flowchart illustrations of programming operations according to some embodiments of the present invention.

FIG. 14. illustrates exemplary programming operations according to some embodiments of the present invention. Channel potentials are boosted (Block 1410), followed by selectively changing the channel potentials according to data to be stored in the memory (Block 1420). Subsequently, a program voltage is applied to a selected word line plate to program a plurality of cells in a level of the device (Block 1430).

Figure 15:
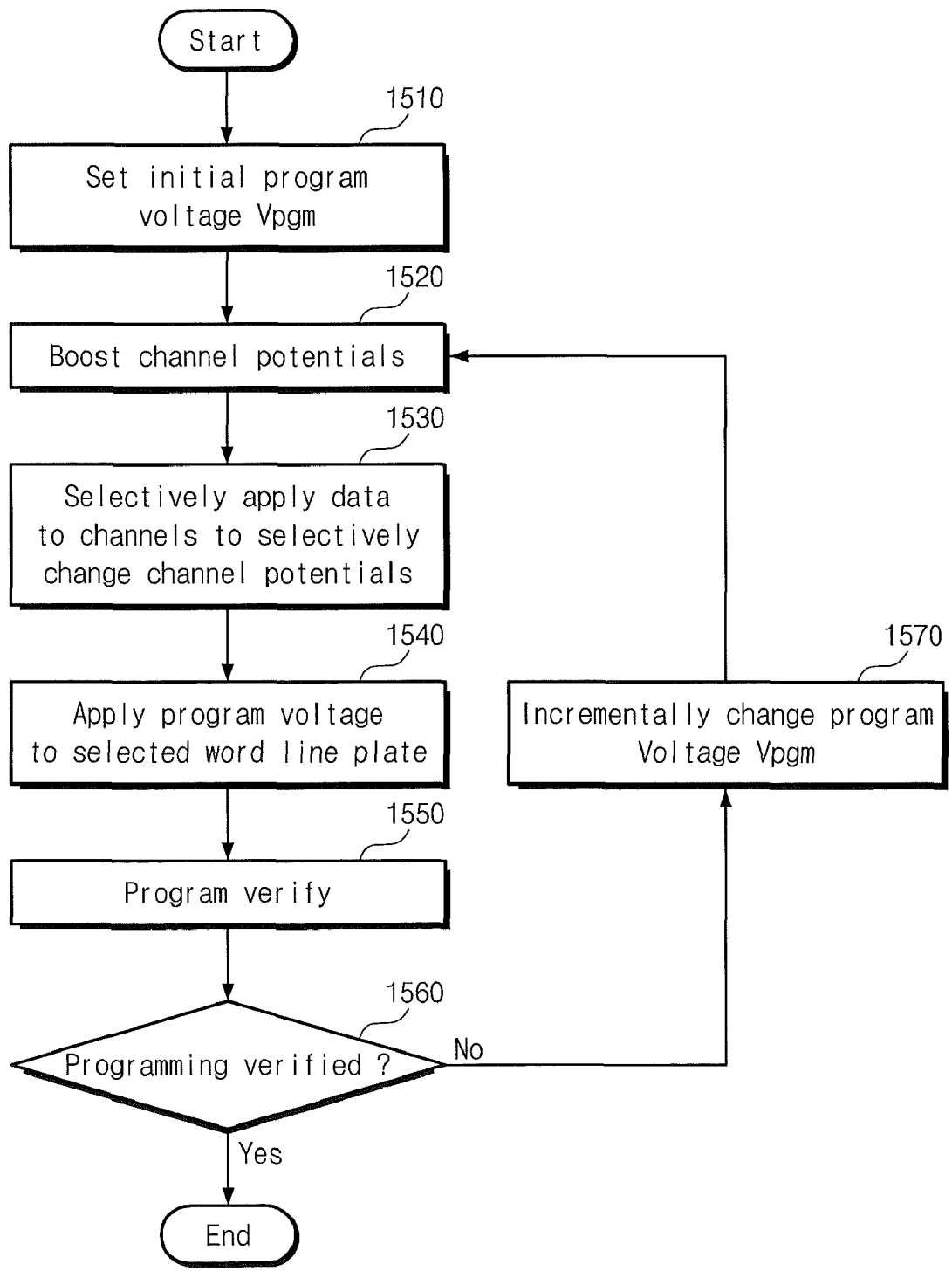

According to further embodiments, programming operations along the lines discussed above may be combined with other techniques. For example, as illustrated in FIG. 15, techniques along the lines discussed above may be used with incremental step pulse programming (ISPP) techniques. An initial program voltage Vpgm is set (Block 1510). Channel potentials are boosted (Block 1520), followed by selectively changing the potentials according to data to be stored in the device (Block 1530) and application of the program voltage Vpgm to a selected word line plate (Block 1540). The cells associated with the selected word line plate may then be read to verify program status (Block 1550). If programming not verified, the program voltage may be incrementally changed (Block 1570) and the boost, data transfer, program voltage application operations and program verification operations repeated (Blocks 1520, 1530, 1540) until programming is verified.

Referring to as FIG. 2, the three dimensional NAND device having vertical memory cell string (VNAND), a plurality of memory cells are disposed in word line plate, and when programming select memory cells of a certain word line plate, unselect memory cells are also subject to programming voltage. According to the present invention, programming data of a plurality of pages are able to be programmed to respective memory cells. Therefore, one programming is able to program memory cells of at least two pages, reducing programming time and lessoning program disturbance.

While the present invention has been particularly shown and described with reference to exemplary embodiments thereof, it will be understood that various changes in form and details may be made therein without departing from the spirit and scope of the following claims.

What is claimed is:
1. A method of programming a memory device comprising an array of vertical channels passing through a stacked plurality of word plates, wherein respective columns of vertical channels are configured to be coupled to respective bit lines, the method comprising:
   boosting potentials of the vertical channels;
   after boosting the potentials of the vertical channels, sequentially and selectively applying respective data to the boosted vertical channels via the bit lines to thereby selectively change the potentials of the boosted vertical channels according to the data; and
   after applying the respective data to the boosted vertical channels, applying a program voltage to a selected word plate to thereby simultaneously program a plurality of memory cells.
2. The method of claim 1:
   wherein respective memory cell strings are configured to be coupled to respective bit lines by respective groups of select gates;
   wherein boosting potentials of the vertical channels comprises applying a first voltage to first ends of the memory cells strings while applying a second voltage greater than the first voltage to the plurality of word plates to thereby boost the potentials of the vertical channels;
   wherein sequentially and selectively applying respective data to the boosted vertical channels via the bit lines to thereby selectively change the potentials of the boosted vertical channels according to the data comprises selectively driving respective ones of the select gates while applying respective data to the bit lines to thereby selectively change the potentials of the boosted vertical channels according to the data; and
   wherein applying a program voltage to a selected word plate to thereby simultaneously program a plurality of memory cells comprises applying a third voltage to the selected word plate to thereby simultaneously program a plurality of memory cells associated with the selected word plate.

3. The method of claim 2, wherein the select gates comprise upper select gates that control connection of the bit line to the column of vertical channels, wherein the memory device further comprises lower select gates that control connection of the vertical channels to a source plate and wherein applying a first voltage to first ends of memory cell strings while applying a second voltage to the plurality of word plates to boost potentials of the column of vertical channels comprises deactivating the upper select gates while applying the first voltage to the lower select gates and the source plate and applying the second voltage to the plurality of word plates.

4. The method of claim 3, wherein applying a first voltage to first ends of memory cell strings while applying a second voltage to the plurality of word plates to boost potentials of the column of vertical channels further comprises applying the first voltage to at least one of the bit lines while applying the first voltage to the lower select gates and the source plate and applying the second voltage to the plurality of word plates.

5. The method of claim 2, wherein the select gates comprise upper select gates that control connection of the bit line to the column of vertical channels, wherein the memory device further comprises lower select gates that control connection of the column of vertical channels to a source plate and wherein applying a first voltage to first ends of memory cell strings while applying a second voltage to the plurality of word plates to boost potentials of vertical channels of the column of vertical channels comprises deactivating the lower select gates while applying the first voltage to the upper select gates and the bit line and applying the second voltage to the plurality of word plates.

6. The method of claim 5, wherein applying a first voltage to first ends of memory cell strings while applying a second voltage to the plurality of word plates to boost potentials of the column of vertical channels further comprises applying a fourth voltage less than the first voltage to the source plate while applying the first voltage to the upper select gates and the bit line and applying the second voltage to the plurality of word plates.

7. The method of claim 2, wherein applying a third voltage to a selected word plate to thereby simultaneously program a plurality of memory cells associated with the column of vertical channels and the selected word plate comprises applying the third voltage to the selected word plate while applying a fourth voltage less than the third voltage to at least one non-selected word plate.

8. The method of claim 7, wherein the fourth voltage is the same as the second voltage.

9. The method of claim 7, wherein the fourth voltage is less than the second voltage.

10. The method of claim 7, wherein applying the third voltage to the selected word plate while applying a fourth voltage less than the third voltage to at least one non-selected word plate comprises applying the third voltage to a selected word plate while applying the fourth voltage to at least one non-selected word plate not immediately adjacent the selected word plate and a fifth voltage less than the fourth voltage to at least one non-selected word plate immediately adjacent the selected word plate.

11. The method of claim 2, wherein selectively driving respective ones of the select gates while applying respective data to the bit lines to thereby selectively change the potentials of the boosted vertical channels according to the data is preceded by loading a plurality of latches with respective ones of a series of data and wherein selectively driving respective ones of the select gates while applying respective data to the bit lines to thereby selectively change the potentials of the boosted vertical channels according to the data comprises selectively driving respective ones of the select gates while connecting respective ones of the latches to the bit line to thereby selective change the potentials the column of vertical channels according to the series of data.

12. The method of claim 1, further comprising verifying a programming state of at least one of the memory cells associated with the selected word plate and, responsive to a verification failure, repeating the steps of boosting potentials of the vertical channels, selectively applying respective data to vertical channels via the bit lines to thereby selectively change the potentials of the boosted vertical channels according to the data and applying a program voltage to a selected word plate at a new program voltage level.

13. The method of claim 1, further comprising repeatedly performing the steps of boosting potentials of the vertical channels, selectively applying respective data to vertical channels via the bit lines to thereby selectively change the potentials of the boosted vertical channels according to the data and applying a program voltage to a selected word plate to thereby perform multi-bit programming of the plurality of memory cells.

14. A three-dimensional memory device comprising:
a memory cell array comprising a plurality of stacked wordline plates;
a decoding circuit configured to apply a pass voltage to the plurality of stacked wordline plates to boost an array of vertical channels passing through the plurality of stacked wordline plates;
a write and read circuit configured to apply a program voltage to a selected word line plate to simultaneously program memory cells of at least two pages after boosting the array of vertical channels; and
a control circuit configured to control a program operation of the write and read circuit and a boosting operation of the decoding circuit.

15. The three-dimensional memory device as set forth in claim 14, wherein the write and read circuit latches program data of at least two pages to be programmed into the memory cells.

16. The three-dimensional memory device as set forth in claim 15, wherein the write and read circuit loads the latched program data in parallel to the memory cells through a plurality of bitlines by the unit of at least one page.

17. The three-dimensional memory device as set forth in claim 14, wherein the control circuit controls channels of the memory cells to be collectively boosted through a plurality of lower select transistors and a common select line corresponding to the memory cells before the program data is loaded to the memory cells.

18. The three-dimensional memory device as set forth in claim 17, wherein the control circuit controls a voltage rising to a predetermined level to be applied to a bitline corresponding to the memory cells during the boosting operation.

19. The three-dimensional memory device as set forth in claim 14, wherein the control circuit controls channels of the memory cells to be collectively boosted through a plurality of upper select transistors and a plurality of bitlines corresponding to the memory cells before the program data is loaded to the memory cells.

20. The three-dimensional memory device as set forth in claim 19, wherein the control circuit controls a voltage rising to a predetermined level to be applied to a common source line corresponding to the memory cells during the boosting operation.

21. The three-dimensional memory device as set forth in claim 14, wherein channels of the memory cells is boosted to a first pass voltage in compliance with the control of the control circuit before program data is loaded to the memory cells.

22. The three-dimensional memory device as set forth in claim 21, wherein the channels of the memory cells is maintained at the first pass voltage or discharged to a ground voltage level according to a value of data to be programmed to the memory cells during a data loading operation to the memory cells.

23. The three-dimensional memory device as set forth in claim 22, wherein states of voltages at the respective channels of the memory cells are determined by the data loading operation and maintained until a program operation is performed.

24. The three-dimensional memory device as set forth in claim 21, wherein when the program data is loaded to the memory cells, the control circuit controls a program operation for the loaded program data to be performed the program operation by applying a program voltage higher than the first pass voltage to the selected wordline plane and applying a second pass voltage equal to or lower than the first pass voltage to unselected wordline planes.

25. The three-dimensional memory device as set forth in claim 24, wherein a difference between the first pass voltage and the second pass voltage is calculated from the amount of charges required to program the memory cells.

26. The three-dimensional memory device as set forth in claim 24, wherein a level of the second pass voltage applied to the respective unselected wordline planes varies with positions of the unselected wordline planes.

27. The three-dimensional memory device as set forth in claim 24, wherein the control circuit controls a local voltage to be applied to at least one wordline plane adjacent to the selected wordline plane among the plurality of unselected wordline planes during the program operation.

28. The three-dimensional memory device as set forth in claim 27, wherein the local voltage is equal to or higher than a ground voltage and lower than the second pass voltage.

29. The three-dimensional memory device as set forth in claim 27, wherein the local voltage is higher than the second pass voltage and lower than the program voltage.

30. The three-dimensional memory device as set forth in claim 27, wherein the control circuit controls the second pass voltage to be applied to at least one unselected wordline plane between the selected wordline plane to which the program voltage is applied and the adjacent wordline plane to which the local voltage is applied during the program operation.

31. A method for programming a three-dimensional memory device, comprising:
performing channel boosting by applying a first pass voltage to a plurality of wordline planes;
loading program data to memory cells of at least two pages disposed at a selected one of the wordline planes; and
simultaneously programming the memory cells to which the program data is loaded.

32. The method as set forth in claim 31, wherein performing channel boosting comprises collectively controlling charge paths to channels of the memory cells through a common select line and a plurality of lower select transistors corresponding to the memory cells.

33. The method as set forth in claim 31, wherein performing channel boosting further comprises boosting a voltage applied to a plurality of bitlines corresponding to the memory cells to a predetermined level.

34. The method as set forth in claim 31, wherein performing channel boosting comprises collectively controlling charges paths to channels of the memory cells through a plurality of bitlines corresponding to the memory cells and a plurality of upper select transistors connected to the respective bitlines.

35. The method as set forth in claim 34, wherein performing channel boosting further comprises boosting a voltage applied to a common source line to a predetermined level.

36. The method as set forth in claim 31, wherein the program data is loaded in parallel through a plurality of bitlines corresponding to the memory cells by the unit of predetermined data.

37. The method as set forth in claim 36, wherein loading program data comprises:
respectively turning on a plurality of upper transistors connected to each bitline connected to the memory cells in sequence;
loading corresponding program data to channels of corresponding memory cells through the respective turned-on upper select transistors;
maintaining or discharging a voltage at the channels of the corresponding memory cells at a level of the first pass voltage or to a level of a ground voltage, depending on values of the respective loaded data; and
respectively turning off the respective turned-on upper select transistors.

38. The method as set forth in claim 31, wherein simultaneously programming the memory cells comprises applying a program voltage higher than the first pass voltage to the selected wordline plane and simultaneously applying a second pass voltage equal to or lower than the first pass voltage to a plurality of unselected wordline planes.

39. The method as set forth in claim 38, wherein charges corresponding to a difference between the first pass voltage and the second pass voltage are separated from the unselected wordline planes and migrate to memory cells of the selected wordline plane.

40. The method as set forth in claim 38, wherein a difference between the first pass voltage and the second pass voltage is calculated from the amount of charges required to program the memory cells of the selected wordline plane.

41. The method as set forth in claim 38, wherein external charge supply to channels of the memory cells is cut off while the first pass voltage and the second pass voltage are applied.

42. The method as set forth in claim 38, wherein simultaneously programming the memory cells further comprises applying a local voltage equal to or higher than a ground voltage and lower than the second pass voltage to at least one wordline plane adjacent to the selected wordline plane.

43. The method as set forth in claim 38, wherein simultaneously programming the memory cells further comprises applying a local voltage higher than the second pass voltage and lower than the program voltage to at least one wordline plane adjacent to the selected wordline plane.

44. The method as set forth in claim 42, wherein simultaneously programming the memory cells further comprises applying the second pass voltage to at least one unselected wordline plane between the selected wordline plane to which the program voltage is applied and the adjacent wordline plane to which the local voltage is applied.

45. The method as set forth in claim 31, wherein the respective memory cells are simultaneously programmed with one or more data bits.

46. A memory system comprising:
a three-dimensional memory device; and
a memory controller configured to control operations of the three-dimensional memory device in response to the request from a host,
wherein the three-dimensional memory device includes a memory cell array comprising a plurality of stacked wordline plates, a decoding circuit configured to apply a pass voltage to the plurality of stacked wordline plates to boost an array of vertical channels passing through the plurality of stacked wordline plates, a write and read circuit configured to apply a program voltage to a selected word line plate to simultaneously program memory cells of at least two pages after boosting the array of vertical channels, and a control circuit configured to control a program operation of the write and read circuit and a boosting operation of the decoding circuit.

* * * * *